(12) United States Patent
Kitabatake et al.

(10) Patent No.: US 7,671,409 B2
(45) Date of Patent: Mar. 2, 2010

(54) WIDE GAP SEMICONDUCTOR POWER DEVICE WITH TEMPERATURE INDEPENDENT RESISTIVITY DUE TO CHANNEL REGION RESISTIVITY HAVING NEGATIVE TEMPERATURE DEPENDENCE

(75) Inventors: Makoto Kitabatake, Nara (JP); Osamu Kusumoto, Nara (JP); Masao Uchida, Osaka (JP); Kunimasa Takahashi, Osaka (JP); Kenya Yamashita, Osaka (JP); Koichi Hashimoto, Osaka (JP)

(73) Assignee: Panasonic Corporation, Kadoma (JP)

( * ) Notice: Subject to any disclaimer, the term of this patent is extended or adjusted under 35 U.S.C. 154(b) by 523 days.

(21) Appl. No.: 11/570,269

(22) PCT Filed: Jun. 10, 2005

(86) PCT No.: PCT/JP2005/010691

§ 371 (c)(1),
(2), (4) Date: Dec. 8, 2006

(87) PCT Pub. No.: WO2005/122273

PCT Pub. Date: Dec. 22, 2005

(65) Prior Publication Data

US 2008/0265260 A1    Oct. 30, 2008

(30) Foreign Application Priority Data

Jun. 11, 2004    (JP) .............................. 2004-174037

(51) Int. Cl.
*H01L 29/24*    (2006.01)
(52) U.S. Cl. ............... 257/341; 257/77; 257/E29.104; 257/469; 257/502; 338/3; 338/8
(58) Field of Classification Search ............... 257/341; 338/7, 9, 22
See application file for complete search history.

(56) References Cited

U.S. PATENT DOCUMENTS 5,736,753 A    4/1998    Ohno et al.

(Continued)

FOREIGN PATENT DOCUMENTS

EP    1306890    5/2003

(Continued)

OTHER PUBLICATIONS

Wang et al. "Thermoelectric Properties of SiC Thick Films Deposited by Thermal Plasma Physical Vapor Deposition," Science and Technology of Advanced Materials 4 (2003) pp. 167-172.*

(Continued)

*Primary Examiner*—Marcos D. Pizarro
*Assistant Examiner*—Raj Gupta
(74) *Attorney, Agent, or Firm*—Renner, Otto, Boisselle & Sklar, LLP

(57) ABSTRACT

A field-effect transistor power device includes a source electrode, a drain electrode, a wide gap semiconductor including a channel region and a drift region, the channel region and the drift region forming a series current path between the source electrode and the drain electrode, a gate insulating film that covers the channel region, and a gate electrode formed on the gate insulating film. In the series current path which is electrically conducting when the field-effect transistor power device is in an ON state, any region other than the channel region has an ON resistance exhibiting a positive temperature dependence, and the channel region has an ON resistance exhibiting a negative temperature dependence. A ratio $\Delta R_{on}/R_{on}(-30°\,C.)$ is 50% or less.

8 Claims, 3 Drawing Sheets

U.S. PATENT DOCUMENTS

| | | | |
|---|---|---|---|
| 5,793,097 A * | 8/1998 | Shimamoto et al. | 257/538 |
| 6,734,462 B1 * | 5/2004 | Shah | 257/77 |
| 2003/0020136 A1 * | 1/2003 | Kitabatake et al. | 257/502 |
| 2004/0007708 A1 * | 1/2004 | Ichinose et al. | 257/79 |
| 2005/0151156 A1 * | 7/2005 | Wu et al. | 257/107 |
| 2008/0217627 A1 * | 9/2008 | Friedrichs et al. | 257/77 |

FOREIGN PATENT DOCUMENTS

| | | |
|---|---|---|
| EP | 1306890 A2 * | 5/2003 |
| JP | 7-131016 | 5/1995 |
| JP | 7-263687 | 10/1995 |
| JP | 9-289312 | 11/1997 |
| JP | 2002-261275 | 9/2002 |

OTHER PUBLICATIONS

Singh R. et al., "Development of High-Current 4H-SiC ACCUFET" IEEE Transactions on Electron Devices, vol. 50, No. 2, Feb. 2003.

Kusumoto O. et al., SiC Vertical DACFET (Vertical Delta-Dropped Accumulation Channel MOSFET) Materials Science Forum vols. 389-393 (2002) pp. 1211-1214.

European Search Report for corresponding application No. 05750446.6 dated Sep. 18, 2008.

International Search Report for corresponding Application No. PCT/JP05/010691 mailed Aug. 30, 2005.

Infineon Technologies; "Cool MOS Power Transistor Data Sheets SPP04N60C3, SPB04N60C3, SPA04N60C3;" Oct. 15, 2002 (cited in [0006], on p. 3 of the description).

H.Yano, et al.; "High Inversion Channel Mobility in 4H-SiC Planar MOSFETs;" FED Journal vol. 11 No. 2; pp. 81-84 (cited in [0011], on p. 6 of the description).

* cited by examiner (a)

(b)

WIDE GAP SEMICONDUCTOR POWER DEVICE WITH TEMPERATURE INDEPENDENT RESISTIVITY DUE TO CHANNEL REGION RESISTIVITY HAVING NEGATIVE TEMPERATURE DEPENDENCE

TECHNICAL FIELD

The present invention relates to a power device utilizing a wide band gap semiconductor.

BACKGROUND ART

Power devices having a high breakdown voltage and a large current capability are used in various fields. A power device has a problem in that the temperature of the power device increases due to power losses, which causes changes in its device characteristics. In order to reduce such changes in the device characteristics, a structure has conventionally been adopted which cools the power device so as to be retained at or below a safe operating temperature. Specifically, the power device is kept in contact with a package base-material, and the heat generated in the power device is allowed to pass into the package base-material, thus minimizing increase in the device temperature.

A power device utilizing a silicon semiconductor (Si power device) which has a band gap of about 1.11 eV at room temperature undergoes a thermal runaway at temperatures over 150° C. and thus is short-circuited, no longer functioning as a current controlling device. Therefore, an Si power device is subjected to a thermal design such that the temperature of a portion of the Si power device having the highest current density will never exceed 150° C. In particular, in the case where the current density inside the Si power device is 50 A/cm$^2$ or above, a considerable heat is generated inside the Si power device, and thus it is necessary to efficiently dissipate the heat.

However, there exists a problem in that, even if the temperature of a power device is maintained at or below a safe operating temperature (150° C.), the electrical resistance of the power device while it is conducting (hereinafter referred to as an "ON resistance") would change responsive to changes in temperature, whereby its reliability is degraded.

An Si-MOSFET (metal-oxide-semiconductor field-effect transistor) will be taken as an example of a conventional Si power device. In an Si-MOSFET, the package base-material itself and the method of mounting the Si-MOSFET onto the package base-material are optimized so that the Si-MOSFET will be retained at or below a safe operating temperature (150° C.) even when operated at full power. So long as the device temperature of the Si-MOSFET is kept at or below 150° C., device destruction will not occur.

However, when the device temperature increases to about 100° C., the ON resistance will usually have significant changes. FIG. 4 is an exemplary graph showing the temperature characteristics of an ON resistance $R_{DS(on)}$ of a conventional Si-MOSFET, which is disclosed in Non-Patent Document 1. As shown in FIG. 4, the ON resistance of the conventional Si-MOSFET increases as the temperature Tj of the device increases. The ON resistance value at 100° C. is twice or more of the ON resistance value at room temperature.

The reasons why the ON resistance of an Si-MOSFET increases with increases in temperature are that the ON resistance is mainly governed by the electrical resistance in a drift region of the Si-MOSFET, and that the electrical resistance of the drift region shows a large temperature dependence. The drift region is a region which contains impurities at a relatively low concentration. It is considered that, when the temperature increases, phonon scattering in the drift region increases to prohibit carrier conduction, thus resulting in an increased electrical resistance.

Temperature-induced changes in the electrical characteristics of an Si-MOSFET cause the following problems.

Circuits for controlling devices such as inverters are, generally speaking, power electronics circuits incorporating switching devices such as Si-MOSFETs. When the electrical characteristics of an Si-MOSFET changes with temperature, the current which flows through a load (e.g., an inverter) of the circuit also changes accordingly. Thus, when a current flowing through a load of a circuit exhibits temperature dependence, there is a problem in that the operation of a system which is controlled by that circuit becomes unstable. In order to allow the system to stably operate, it would be necessary to ensure that the same current will be supplied to the addition of the circuit even if the ON resistance of the Si-MOSFET increases as a result of a temperature increase of the Si-MOSFET, e.g., through a feedback control which increases the voltage. However, the circuit structure would be complicated and the manufacturing cost would increase with the provision of such a feedback control.

Si power devices other than Si-MOSFETs also permit their electrical characteristics to change with temperature, and have similar problems to the above. An Si-IGBT (insulated-gate bipolar transistor) is described as an example of another Si power device. The ON resistance of an Si-IGBT decreases with an increase in temperature. Therefore, when a circuit including an Si-IGBT is constructed, if the electrical resistance of the Si-IGBT decreases due to an increase in temperature of the Si-IGBT, it is necessary to perform a feedback control which lowers the voltage. Moreover, the ON resistance of an IGBT exhibits a greater temperature dependence than that of the ON resistance of an Si-MOSFET. Therefore, it is necessary to subject the Si-IGBT to a thermal design such that the heat generated due to a current flowing through the Si-IGBT during operation can be dissipated with an even higher efficiency, thus to maintain the temperature of the Si-IGBT at a low temperature.

As for SiC, characteristics evaluations of the ON resistance of MOSFETs are disclosed in Patent Documents 1 and 2, and Non-Patent Document 2.

[Patent Document 1] Japanese Laid-Open Patent Publication No. 2002-261275

[Patent Document 2] Japanese Laid-Open Patent Publication No. 7-131016

[Non-Patent Document 1] Infineon Technologies, Cool MOS Power Transistor data sheets SPP04N60C3, SPB04N60C3, SPA04N60C3

[Non-Patent Document 2] "Planar-type 4H-SiC MOSFETs having High Inversion Layer Channel Mobility", FED Journal Vol. 11 No. 2 (2000), FIG. 3 on p. 82

DISCLOSURE OF INVENTION

Problems to be Solved by the Invention

As described above, the electrical characteristics of a conventional Si power device change depending on the device temperature. Therefore, in order to allow a system to stably operate by using a circuit including any Si power devices, it would be necessary to perform a feedback control so that a constant current would flow through the addition of the circuit, thus complicating the circuit structure.

The present invention has been made in view of the aforementioned circumstances, and an objective thereof is to provide a power device whose ON resistance has reduced temperature-induced changes.

Means for Solving the Problems

A power device according to the present invention is a power device comprising: a source electrode; a drain electrode; and a wide gap semiconductor including a channel region and a drift region, the wide gap semiconductor forming a series current path between the source region and the drain electrode, wherein, in the series current path, any region other than the channel region has an ON resistance exhibiting a positive temperature dependence, and the channel region has an ON resistance exhibiting a negative temperature dependence, and with respect to an ON resistance of the entire power device at −30° C., a ratio of change in the ON resistance of the entire power device when a temperature of the power device is varied from −30° C. to 100° C. is 50% or less.

In a preferred embodiment, a temperature-induced change in the ON resistance of the entire power device is derived by allowing a temperature-induced change $\Delta R_p$ in the ON resistance in any region in the current path other than the channel region and a temperature-induced change $\Delta R_n$ in the ON resistance in the channel region to cancel out each other.

In a preferred embodiment, when the temperature of the power device is varied from −30° C. to 100° C., an absolute value of the temperature-induced change $\Delta R_p$ is no less than ½ as much and no more than twice as much as the temperature-induced change $\Delta R_n$.

In a preferred embodiment, when a channel mobility of electrons at 300K is 10 cm$^2$/Vs or above and the temperature of the power device is no less than −30° C. and no more than 100° C., the ON resistance in the channel region is no less than twice as much and no more than twenty times as much as the ON resistance in any region in the current path other than the channel region.

In a preferred embodiment, when the temperature of the power device is no less than −30° C. and no more than 100° C., an ON resistance in the channel region is 200 mΩcm$^2$ or less.

In a preferred embodiment, a current having a current density of 50 A/cm$^2$ or more flows through the series current path.

In a preferred embodiment, the wide band gap semiconductor is silicon carbide.

In a preferred embodiment, the power device comprises a silicon carbide substrate and a silicon carbide layer formed on a principal face of the silicon carbide substrate, and the source electrode is provided on the silicon carbide layer, and the drain electrode is formed on a back face of the silicon carbide substrate.

In a preferred embodiment, the principal face of the silicon carbide substrate is a (0001) plane.

EFFECTS OF THE INVENTION

According to the present invention, there is provided a power device which is highly stable against temperature, and which undergoes a reduced change in its ON resistance against device temperature. It is advantageous to construct a power electronics circuit (e.g., an inverter circuit) by using such a power device because it is not necessary to provide any superfluous circuitry for feedback control. Therefore, there is provided a highly reliable power electronics circuit having a simple structure, whose feedback circuit is simplified or omitted, and which realizes a stable operation of a system. Furthermore, a highly reliable power electronics system incorporating such a power electronics circuit can be realized.

Figure 1:
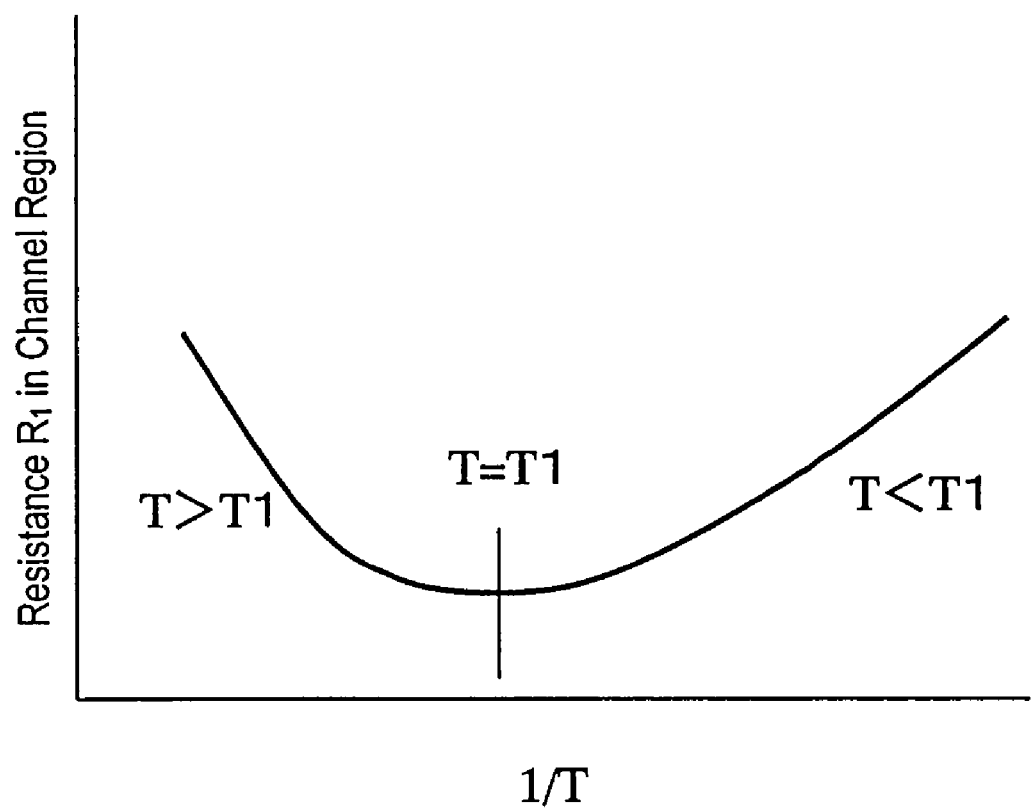
[FIG. 1] A graph showing a relationship between the electrical resistance of a channel region of an SiC-MOSFET and the device temperature.

DESCRIPTION OF THE REFERENCE NUMERALS 1 channel region
2 JFET (junction) region
3 drift region
4 substrate
5 channel layer
8 well region
9 contact region
10 silicon carbide layer
11 drain electrode
13 source electrode
15 gate insulating film
17 gate electrode

BEST MODE FOR CARRYING OUT THE INVENTION

A power device according to the present invention has: a portion whose electrical resistance in a conducting state decreases at a desired rate responsive to a temperature increase (a channel region); and a portion whose electrical resistance in a conducting state increases at a desired rate responsive to a temperature increase (a region which is in series connection with the channel region). By allowing the changes in electrical resistance of these portions to cancel out each other, it is ensured that, with respect to the electrical resistance in a conducting state of the entire power device at −30° C., the amount of change in the electrical resistance in a conducting state at 100° C. is 50% or less. Such a power device is formed by using a wide gap semiconductor, such as silicon carbide (SiC). In the present specification, a "power device" refers to a semiconductor device which has a breakdown voltage of 100 V or more and which controls a current of 1 A or more.

In accordance with a conventional power device using Si, in the case of e.g. an MOSFET, the overall ON resistance is mainly governed by the ON resistance in its drift region. Therefore, the ON resistance of the entire MOSFET would exhibit a temperature dependence similar to that of the ON resistance in the drift region.

In order to reduce the temperature dependence of the ON resistance of a power device, the inventors have conducted various studies directed to power device structures. In doing so, the inventors paid attention to the fact that, when an MOSFET is formed by using a wide gap semiconductor such as SiC, the ON resistance in the channel region is much higher than the ON resistance in the channel region of an Si-MOS- FET. In the present specification, a "wide band gap semiconductor" means a semiconductor whose energy difference (band gap) between the lower end of the conduction band and the upper end of the valence band is 2.0 eV or more. Examples of wide band gap semiconductors thus defined include, besides SiC, III-group nitrides such as GAN and AlN, diamond, and the like.

Since SiC has an interface state density which is one or more digits higher than that of Si, the channel mobility of an SiC-MOSFET (i.e., the field-effect mobility in its channel region) is low, and therefore the ON resistance in its channel region is very high. The ON resistance in the channel region of a conventional SiC-MOSFET may be 100 times or more of the ON resistances in the other regions (e.g., the drift region) of the device. This is a cause for the increased ON resistance of an SiC-MOSFET, and development efforts are being made to realize a low ON resistance/low loss power device by reducing the ON resistance in the channel region. Conversely, the present invention takes advantage of the fact that the ON resistance in the channel region of an SiC-MOSFET is so high as to affect the ON resistance of the entire device, thus providing an improved stability against temperature in a power device such as an MOSFET.

According to the studies of the inventors, it was found that the temperature dependence of the ON resistance in the channel region of an SiC-MOSFET can be controlled based on the structure and/or formation method, etc., of the channel region. FIG. 1 is an exemplary graph showing the temperature dependence of the ON resistance in the channel region. In FIG. 1, the horizontal axis is 1/T (T: temperature of the device), whereas the vertical axis is the electrical resistance in a conducting state (ON resistance) $R_1$ in the channel region. As can be seen from FIG. 1, the gradient of the graph of the ON resistance $R_1$ in the channel region can be varied between a region of higher temperatures than a temperature T1 at which the ON resistance R1 becomes minimum and a region of lower temperatures than temperature T1.

Based on this knowledge, it is possible to design the temperature dependence of the ON resistance in the channel region so as to be opposite to the temperature dependence of the electrical resistance in the other regions of the device.

Note that it is in itself known that there may be cases where the ON resistance R1 in the channel region has a "negative" temperature dependence (Non-Patent Document 2). However, such a "negative" temperature dependence has been observed in the case where the channel mobility of electrons at 300K is at a level sufficiently lower than 10 cm$^2$/Vs. When the channel mobility is 10 cm$^2$/Vs or above, the temperature dependence of the ON resistance tends to be "positive". This point will be described in detail later.

According to the present invention, it has been found that, through adjustments of various design parameters, the temperature dependence of the ON resistance R1 in the channel region can be made "negative" even in the case where the channel mobility is 10 cm$^2$/Vs or above, and that its value can be adjusted to a level that cancels the temperature dependence (positive) of the ON resistance in the other regions, whereby the present invention was accomplished.

In the present invention, by taking into consideration the environment in which the power device may be used and the heat releasing structure for the power device, the device temperature range is assumed to be from −30° C. to 100° C., and a designing is carried out so that the ON resistance has a high stability in this range. More specifically, the power device is to be designed so that a ratio ($\Delta R_{on}/R_{on(-30° C.)}$) of a change $\Delta R_{on}$ in the ON resistance when the device temperature is varied from −30° C. to 100° C., as taken with respect to an ON resistance $R_{on(-30° C.)}$ at −30° C., is 50% or less. As a result, it becomes possible to employ a simplified feedback circuit when forming a power electronics circuit which includes the power device. Note that, if the aforementioned ratio ($\Delta R_{on}/R_{on(-30° C.)}$) exceeds 50%, the ON resistance of the power device would increase at high temperatures, so that a sufficient current would not flow in the power electronics circuit. Therefore, without performing a feedback control, the power of a device to be controlled by such a power electronics circuit would become lower.

Hereinafter, with reference to the figures, the structure of a power device according to an embodiment of the present invention will be described. The present embodiment is a vertical MOSFET which uses silicon carbide (SiC).

The MOSFET of the present embodiment has a plurality of unit cells. FIG. 2(a) is a plan view showing the structure of four unit cells among them. FIG. 2(b) is a cross-sectional view taken along A-A' in FIG. 2(a).

Figure 2:
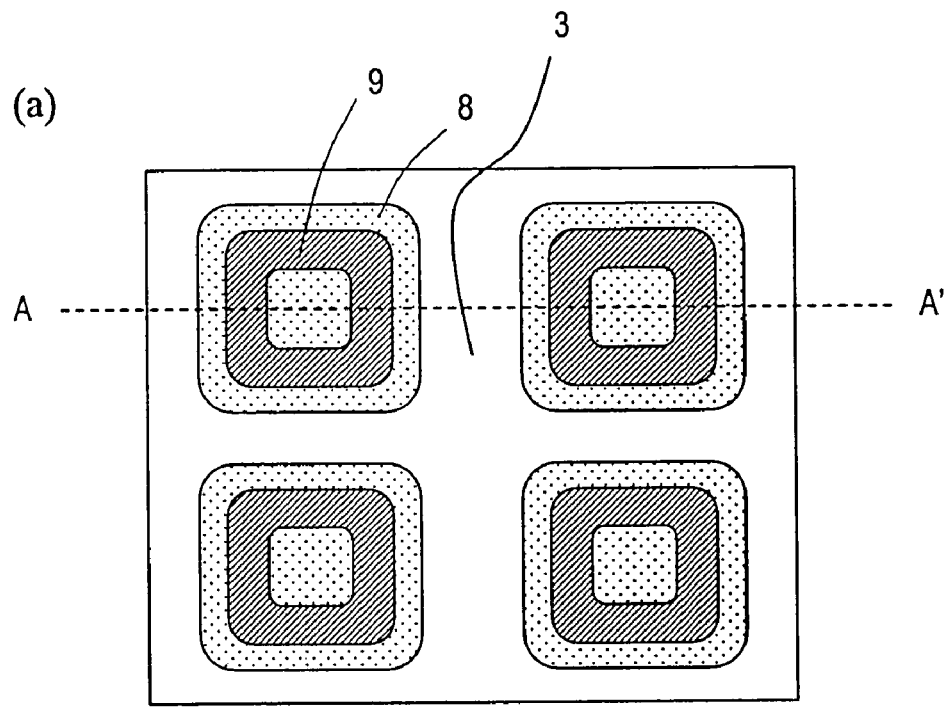
[FIG. 2] (a) and (b) are a plan view and a cross-sectional view, respectively, of a power device according to an embodiment of the present invention.
Figure 2:
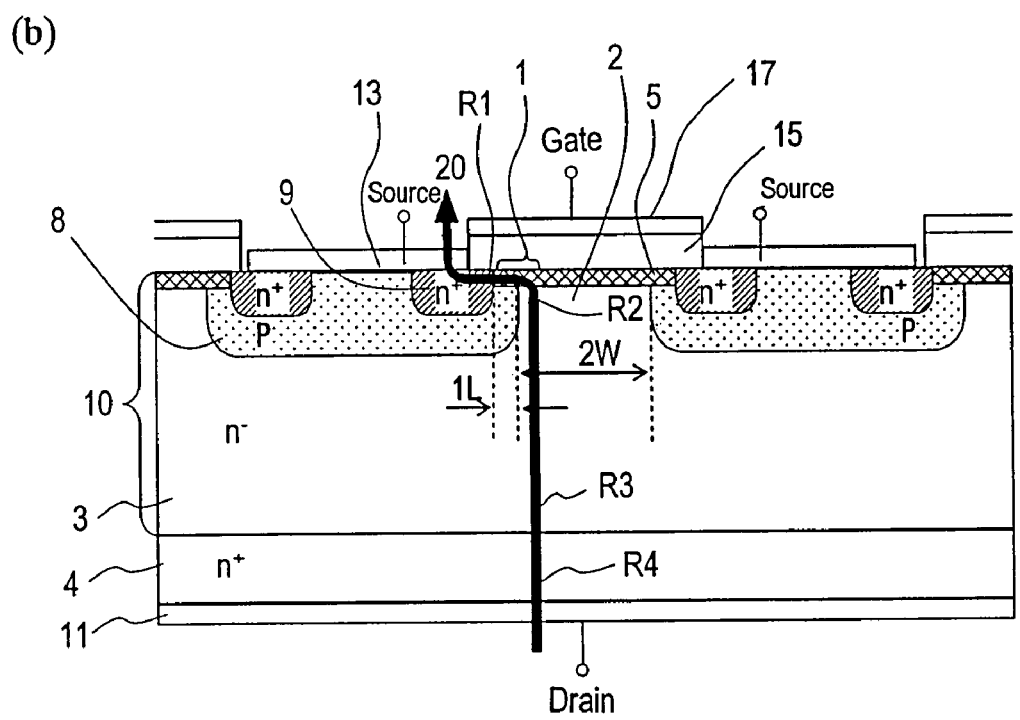

As shown in FIG. 2, in this MOSFET, a silicon carbide layer 10 which is formed on a principal face of an n-type SiC substrate 4 includes a drift region 3, p-type well regions 8, contact regions (n$^+$ regions) 9 which are formed inside the well regions 8, and a channel layer 5. The channel layers 5 has an accumulation channel structure including an n-type SiC layer, for example. A portion of the channel layer 5 which is in contact with the upper face of a well region 8 serves as a channel region 1. The drift region 3, which is an n-type high resistance region, is connected to the contact regions 9 via the channel region 1. Each contact region 9 is connected to a source electrode 13 which is formed on the silicon carbide layer 10. Above each channel region 1, a gate electrode 17 is provided with a gate oxide film 15 interposed therebetween. On the other hand, a drain electrode 11 is formed on the back face of the SiC substrate 4.

For example, the MOSFET of FIG. 2 is prescribed to be a normally-off type such that, when a voltage is applied to the gate electrode 17, a current flows from the drain electrode 11 to the source electrode 13 via the channel region 1 (ON state). In a state where no voltage is applied to the gate electrode 17 (OFF state), the channel region 1 is depleted. Furthermore, the pn junction between the p-type well region 8 and the n-type drift region (n-region) 3 is reverse biased, so that a depletion layer extends mainly from the well region 8 to the drift region 3, and a JFET region (junction region) 2 between adjoining well regions is depleted. As a result, no current can flow from the drain electrode 11 to the source electrode 13.

In an ON state, a current from the drift electrode 11 flows through the SiC substrate 4, the drift region 3, the JFET region 2, and the channel region 1, thus flowing into the source electrode 13. A schematic path of such a current is shown with an arrow 20 in FIG. 2. The ON resistance $R_{on}$ of the MOSFET is a sum of the electrical resistances in the respective regions along the current path 20, that is, a sum of a resistance $R_4$ of the SiC substrate 4, a resistance $R_3$ of the drift region 3, a resistance $R_2$ of the JFET region 2, and a resistance $R_1$ of the channel region 1 ($R_{on}=R_1+R_2+R_3+R_4$).

Figure 3:
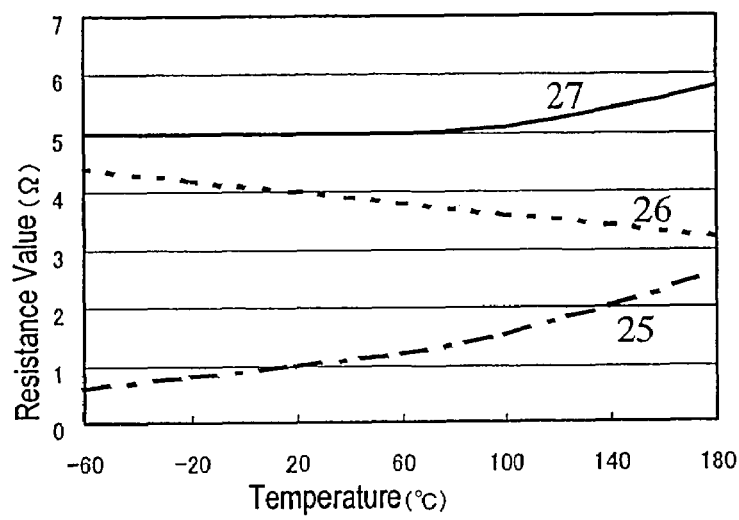
[FIG. 3] A graph showing temperature-induced changes in the ON resistance of an MOSFET according to an embodiment of the present invention.
Figure 4:
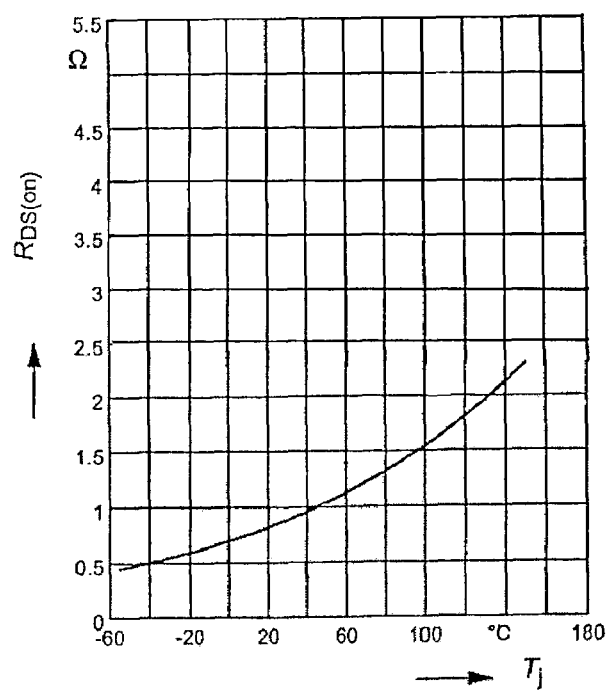
[FIG. 4] A graph showing temperature-induced changes in the ON resistance of a conventional Si power device.

Among the regions along the current path 20, the electrical resistances $R_2$, $R_3$ and $R_4$ of the JFET region 2, the drift region 3, and the substrate 4 have a positive temperature dependence, and thus increase with a temperature increase. A sum ($R_2+R_3+R_4$) of the electrical resistances of these regions is shown by a curve 25 in FIG. 3, for example. These portions, a sum of whose electrical resistances are shown as ($R_2+R_3+R_4$), correspond to the aforementioned "portion whose electrical resistance in a conducting state increases at a desired rate responsive to a temperature increase (a region which is in series connection with the channel region)".

On the other hand, as described earlier, the temperature dependence of the electrical resistance $R_1$ in the channel region 1 may vary depending on the structure and/or formation method, etc., of the channel region 1, and also on the temperature range. Therefore, the structure and formation method of the channel layer 5 is controlled so that the electrical resistance $R_1$ in the channel region 1 has a negative temperature dependence at any temperature from −30° C. to 100° C. The electrical resistance $R_1$ in the channel region 1 is shown by a curve 26 in FIG. 3, for example. The specific structure and/or formation method of the channel layer 5 will be described later.

Thus, when the device temperature is varied from T1 to T2 (T1, T2: within a range from −30° C. to 100° C.), the temperature-induced changes $\Delta(R_2+R_3+R_4)=\Delta Rp$ in the electrical resistances in the JFET region 2, drift region 3 and the substrate 4 cancel out the temperature-induced change $\Delta R_1 = \Delta Rn$ in the electrical resistance in the channel region 1, or vice versa. As a result, as shown by a curve 27 in FIG. 3, the ON resistance $R_{ON}$ of the entire MOSFET has a smaller temperature dependence than conventionally. Specifically, a ratio ($\Delta R_{on}/R_{on(-30°\,C.)}$) of a change $\Delta R_{on}$ in the ON resistance when the device temperature is varied from −30° C. to 100° C., as taken with respect to an ON resistance $R_{on(-30°\,C.)}$ at −30° C., is 50% or less.

In order to ensure that the temperature-induced changes $\Delta(R_2+R_3+R_4)$ in the ON resistances in the JFET region 2, drift region 3 and the substrate 4 cancel out the temperature-induced change $\Delta R_1$ in the ON resistance in the channel region 1 (or vice versa) when the device temperature is varied from −30° C. to 100° C., it is preferable that the absolute value of $\Delta(R_2+R_3+R_4)$ is no less than ½ as much and no more than twice as much as the absolute value of $\Delta R_1$.

Note that, based on the structure and/or formation method of the channel layer 5, not only the temperature dependence of the ON resistance $R_1$ but also the value of the electrical resistance $R_1$ can be controlled. In order to more effectively reduce the temperature dependence of the ON resistance $R_{on}$, it is preferable that the ON resistance $R_1$ is approximately no less than twice as much and no more than twenty times as much as the sum $(R_2+R_3+R_4)$ of the resistances of the JFET region 2, the drift region 3, and the substrate 4. If it is less than twice as much, the temperature-induced changes $\Delta(R_2+R_3+R_4)$ in the ON resistances in the JFET region 2, the drift region 3, and the substrate 4 would become far greater than the temperature-induced change $\Delta R_1$ in the ON resistance in the channel region 1, so that the temperature dependence (positive) of ON resistance would not be sufficiently reduced. Conversely, if it is greater than twenty times as much, the temperature dependence of the electrical resistance in the channel region 1 would be predominant, thus making it difficult to sufficiently reduce the temperature dependence (negative) of ON resistance. More preferably, the ON resistance $R_1$ in the channel region 1 is no less than twice and no more than ten times, and still more preferably about five times, as much as the sum $(R_2+R_3+R_4)$ of the ON resistances of the JFET region 2, the drift region 3, and the substrate 4. When it is about five times as much, the changes $\Delta(R_2+R_3+R_4)$ and $\Delta R_1$ of temperature dependence cancel out each other, so that the temperature dependence of the ON resistance $R_{on}$ of the entire MOSFET can be made substantially zero.

Although there is no particular limitations as to the current density of the ON current which flows through the current path in the power device of the present invention, the temperature dependence of the ON resistance $R_{on}$ can be reduced more effectively when the ON current has a large current density (e.g., 50 A/cm² or more).

Hereinafter, an example of an MOSFET according to the present embodiment will be described.

The MOSFET according to the present example basically has the structure shown in FIG. 2, and has a breakdown voltage of 600 V. The MOSFET according to the present example is designed so that the temperature dependence of the ON resistance of the entire MOSFET can be made substantially zero. Specifically, it is designed as described below.

The MOSFET (area: 0.01 mm²) is composed of nine unit cells. In each unit cell, the p-type well region 8 (size: 15 μm×15 μm) has an impurity concentration (Al concentration) of $1\times10^{18}$ cm$^{-3}$. The channel layer 5 is an SiC layer which has a thickness of 150 nm and contains an n-type impurity (N) at a concentration of $1\times10^{17}$ cm$^{-3}$. A portion of the channel layer 5 which is located above the p-type well region 8 (i.e., the channel region 1) has a length (channel length) 1L of 2 μm. An interval 2W between adjoining well regions 8 is 3 μm.

Furthermore, through appropriate adjustments of the n-type impurity concentration in the SiC substrate 4, the n-type impurity concentration in the drift region 3, and the like, the sum $(R_2+R_3+R_4)$ of the ON resistances in the JFET region 2, the drift region 3, and the substrate 4 is adjusted so that the sum $(R_2+R_3+R_4)$ of electrical resistances in an ON state is 30 Ω when the device temperature is room temperature. On the other hand, the channel region 1 has an electrical resistance $R_1$ of 150 Ω. Therefore, the ON resistance $R_1$ in the channel region 1 is about five times as much as the sum of the ON resistances in the other regions. As a result, the change of temperature dependence in the channel region and the change of temperature dependence the other regions cancel out each other, whereby the temperature dependence of the electrical resistance of the entire MOSFET can be kept substantially zero.

With the MOSFET according to the present example, a ratio ($\Delta R_{on}/R_{on(-30°\,C.)}$) of the difference $\Delta R_{on}$ (=$R_{on(100°\,C.)}$−$R_{on(-30°\,C.)}$) between the ON resistance $R_{on(-30°\,C.)}$ at −30° C. and the ON resistance $R_{on\,(100°\,C.)}$ at 100° C. with respect to the ON resistance $R_{on(-30°\,C.)}$ at −30° C. can be kept at 10% or less. Therefore, it can be confirmed that a very stable circuit can be constructed by using the MOSFET according to the present example. There is an advantage in that it is not necessary to provide superfluous feedback circuitry for this circuit.

In the present example, the drift region 3, the well region 8, the contact region 9, the electrodes 11, 13 and 17, and the like are formed by known methods. The channel layer 5 can be formed by using a CVD technique, for example. At this time, by optimizing the CVD growth condition and the like, the surface planarity of the channel layer 5 is ensured. Preferably, the surface irregularities of the channel layer 5 are controlled so as to be sufficiently small relative to the thickness of the channel layer 5, e.g., equal to or less than 15 nm, which is 10% of the thickness of the channel layer 5. As a result, a channel layer 5 which has a low resistance (150 Ω) and a negative temperature dependence can be obtained. Note that if the channel layer 5 has large surface irregularities (e.g., about 100 nm), the ON resistance $R_1$ in the channel layer 5 may become as high as 600 Ω or more, thus being equal to or greater than twenty times as much as the sum $(R_2+R_3+R_4)$ of the electrical resistances in the other regions.

Moreover, the inventors have confirmed that, in order to control the resistance $R_1$ and the temperature dependence of the channel layer 5, it is effective to control the thickness of the gate oxide film 15 formed on the channel layer 5 and the heat treatment condition (activation anneal, etc.) of the channel layer 5.

In the present example, the ON resistance $R_1$ in the channel layer 5 was able to be reduced to 150 Ω as described above, with the thickness of the gate oxide film 15 being 80 nm. However, the ON resistance $R_1$ in the channel layer 5 will increase as the thickness of the gate oxide film 15 is increased. When the thickness is 100 nm or more, the ON resistance $R_1$ in the channel layer 5 will be 600 Ω or more. On the other hand, by reducing the thickness of the gate oxide film 15 from 80 nm, the ON resistance $R_1$ n the channel layer 5 will be reduced from 150 Ω.

Also, the temperature dependence of the channel layer 5 will change with the thickness of the gate oxide film 15. Specifically, as the thickness of the gate oxide film 15 is decreased, the temperature region in which the ON resistance $R_1$ in the channel layer 5 has a negative temperature dependence will shift more toward the lower temperature side. In other words, it has been confirmed that the temperature T1 (FIG. 1) at which the ON resistance $R_1$ in the channel layer 5 is minimized becomes lower. In this case, the negative coefficient of temperature dependence of the ON resistance $R_1$ in the channel layer 5 will be reduced.

Thus, in order to reduce the temperature dependence of the ON resistance of the entire power device by controlling the resistance $R_1$ and the temperature dependence of the channel layer 5, it is necessary to optimize the thickness of the gate oxide film 15 and the condition for forming the channel layer 5, and the like.

Note that the above example illustrates an exemplary condition for forming the channel layer 5 and the gate oxide film 15 with respect to an MOSFET device having a breakdown voltage of 600 V. For example, if the breakdown voltage of the MOSFET device changes, the sum $(R_2+R_3+R_4)$ of the electrical resistances in the regions other than the channel layer 5 will change, so that the optimum value of the ON resistance $R_1$ and the optimum value of the coefficient of temperature dependence of the channel layer 5 will also change.

When canceling out the temperature dependence of the electrical resistances in the other regions with the temperature dependence of the ON resistance R1 in the channel layer 5, it is preferable that the sum $(R_2+R_3+R_4)$ of the electrical resistances in the other regions is 10 m Ωcm² or less. If the sum of these electrical resistances exceeds 10 mΩcm², the temperature-induced changes $\Delta(R_2+R_3+R_4)$ in the sum of the electrical resistances when the temperature of the power device is varied from −30° C. to 100° C. would become correspondingly greater, thus making themselves difficult to be canceled by the temperature-induced change $\Delta R_1$ in the ON resistance $R_1$ in the channel layer 5.

In preferable embodiments of the present invention, the channel mobility of electrons in the channel layer 5 is 10 cm²/Vs or above at room temperature (300K). If the channel mobility is lower than 10 cm²/Vs, the ON resistance R1 in the channel layer 5 would be too large, thus resulting in large current losses and detracting from the suitability as a power device.

As mentioned earlier, it is in itself known that there may be cases where the ON resistance in the channel layer has a negative temperature dependence in a state where the channel mobility of electrons at 300K is lower than 10 cm²/Vs. However, even if a transistor is formed by using such a channel layer, the transistor would have large losses, and thus not qualify as a practical power device.

Note that Non-Patent Document 2, supra, also teaches that a channel mobility as high as 10 cm²/Vs or above can be achieved by forming the channel region on the (03-38) plane or the (11-20) plane. However, their channel mobilities decrease with increases in temperature, and the ON resistances in such channel layers have a "positive" temperature dependence.

On the other hand, according to the present embodiment, a channel layer whose channel mobility shows a value as high as 10 cm²/Vs or above and increases (i.e., the ON resistance decreases) with a temperature increase is formed, thus suppressing the temperature dependence of the ON resistance of the entire power device.

In the present embodiment, a channel region is formed on the (0001) plane of 4H-SiC, and moreover, the nitrogen concentration at the MOS interface ($SiO_2$/SiC interface) is adjusted to a range of no less than $1\times10^{20}$ cm$^{-2}$ and no more than $1\times10^{22}$ cm$_{-2}$. At the $SiO_2$/SiC interface on the (0001) plane of 4H-SiC, impurities such as carbon and dangling bonds exist, which lower the channel mobility. However, by adjusting the nitrogen concentration at the interface so as to be within the aforementioned range, the impurities and dangling bonds can be inactivated (passivation), whereby the interface state density can be reduced, and a high channel mobility can be realized.

In the present invention, while adjusting the channel mobility (300K) of electrons in the channel region to be 10 cm²/Vs or above, the temperature characteristics thereof are utilized. Note that, in order to realize a channel mobility and temperature dependence suitable for the present invention, it is preferable that the interface state density is $1\times10^{12}$ cm$^{-2}$/eV or below in the potential range near a band end of at least one of the conduction band and the valence band.

Note that it is preferable to form a channel region by stacking at least one layer of high concentration portion in which there is a concentration of $1\times10^{16}$ cm$^{-3}$ or more of an impurity which defines the conductivity type of the channel region and at least one layer of low concentration portion in which there is less than $1\times10^{16}$ cm$^{-3}$ of it (an intrinsic semiconductor not containing impurities). An example of such a layered structure is a δ doped multilayer structure (alternately stacked δ doped layers+undoped layers). For example, the δ doped layer(s) is prescribed to be about 10 nm, and the undoped layer(s) is prescribed to be about 40 nm. With such layer thicknesses, if three δ doped layers and four undoped layer are alternately stacked, for example, it follows that 30 nm+160 nm=190 nm, and thus total thickness of the layered structure of the channel region will be about 0.2 μm.

By using a channel region having such a layered structure, it is possible to realize, with a good reproducibility, a channel mobility as high as 10 cm²/Vs or above and characteristics such that the channel mobility increases with a temperature increase. It is presumably because such a layered channel structure increases the channel current density in regions away from the MOS interface that both a high channel mobility and desired temperature characteristics are satisfied. From experimentation, it is preferable to prescribe the total thickness of the layered channel region to 1 μm or less, and even more preferably 0.5 μm or less.

In a power device temperature range of no less than −30° C. and no more than 100° C., when the sum $(R_2+R_3+R_4)$ of the electrical resistances in the other regions is equal to or less than the aforementioned upper limit value (10 mΩcm²), it would be preferable that the ON resistance $R_1$ in the channel layer 5 is 200 mΩcm² or less in order to more effectively cancel the temperature-induced changes $\Delta(R_2+R_3+R_4)$ in the sum of the electrical resistances. More preferably, the ON resistance $R_1$ in the channel layer 5 in the aforementioned temperature range is equal to or less than 50 mΩcm², which is five times as much as the sum ($R_2+R_3+R_4$) of the electrical resistances in the other regions. If it is equal to or less than 50 m$\Omega$cm$^2$, the power device can have low losses while suppressing the temperature-induced change in the ON resistance of the entire power device.

The channel length 1L, thickness, and impurity concentration of the channel layer 5 may vary depending on the sizes, resistance values, and the like of the other portions of the MOSFET. Moreover, the structure and/or formation method of the channel layer 5 are not limited to the above-described structure and/or formation method, but is appropriately selected so that the channel region 1 will have an electrical resistance $R_1$ in the desired range and that the electrical resistance $R_1$ in the channel region 1 will have a desired temperature dependence. In order to reduce the influence of the interface state and improve channel mobility, it is preferable that the channel layer 5 has an accumulation channel structure. The accumulation channel structure may be, as the Applicant discloses in Japanese Patent Application No. 2002-544789, a structure ($\delta$ doped structure) in which an undoped SiC layers and n-type doped layers ($\delta$ doped layers) are alternately stacked. In that case, by changing the impurity concentration in the $\delta$ doped layers and the thicknesses of the $\delta$ doped layers and the undoped layers, especially the thickness of an undoped SiC layer at the uppermost face of the $\delta$ doped structure, for example, the ON resistance $R_1$ in the channel region 1 can be adjusted.

Note that the aforementioned electrical resistance values ($R_1$: 150 $\Omega$, $R_2+R_3+R_4$: 50 $\Omega$) are obtained because the area of the MOSFET according to the present example is as small as 0.01 mm$^2$. However, the electrical resistance values will decrease as the device area of the MOSFET is increased or as the integration degree of unit cells is increased. Specifically, in the case of an MOSFET having a similar structure to that of the present example and an area of 1 mm$^2$, the electrical resistance values of the respective regions will be 1/100 of the electrical resistance values according to the present example. In the case of an MOSFET having an area of 1 cm$^2$, the electrical resistance values will be 1/10000 of the electrical resistance values according to the present example.

In the above example, by controlling the value of the electrical resistance $R_1$ and the temperature dependence of the channel region 1, the rate ($\Delta R_{on}/R_{on(-30}$°C.$_)$) of temperature-induced change in the ON resistance is kept at 50% or less, and preferably at 10% or less. Conversely, the temperature-induced change in the ON resistance of the entire device can be suppressed by intentionally increasing the electrical resistance values in regions having a positive temperature dependence, e.g., the drift region 3. Alternatively, the temperature-induced change in the ON resistance $R_{on}$ of the entire MOSFET may be suppressed by controlling both the resistance values in regions having a negative temperature dependence (e.g., the channel region 1) and the resistance values in regions having a positive temperature dependence (e.g., the drift region 3). Note that the electrical resistance $R_3$ in the drift region 3 can be adjusted by changing the impurity concentration in the drift region 3, for example.

The power device according to the present invention is not limited to an MOSFET as shown in FIG. 2. It may be any power semiconductor device which has a transistor structure, and whose current path includes a portion having a positive temperature dependence and a portion having a negative temperature dependence. For example, it may be an FET (field-effect transistor) such as JFET, MISFET or MESFET, or a bipolar/conductivity modulation type switching device such as IGBT.

INDUSTRIAL APPLICABILITY

According to the present invention, a highly reliable power device undergoes a reduced temperature-induced change in its ON resistance can be provided. The present invention is applicable to a power FET utilizing a wide band gap semiconductor, such as MOSFET, MISFET, MESFET, JFET, and IGBT.

By using the power device according to the present invention, a highly stable control circuit can be constructed without providing superfluous feedback circuitry therein. Moreover, a highly reliable system incorporating such a control circuit can be constructed.

The invention claimed is:

1. A field-effect transistor power device comprising:
   a source electrode;
   a drain electrode;
   a wide gap semiconductor including a channel region and a drift region, the channel region and the drift region forming a series current path between the source electrode and the drain electrode,
   a gate insulating film that covers the channel region, and
   a gate electrode formed on the gate insulating film, wherein,
   in the series current path which is electrically conducting when the field-effect transistor power device is in an ON state, any region other than the channel region has an ON resistance exhibiting a positive temperature dependence, and the channel region has an ON resistance exhibiting a negative temperature dependence, and
   a ratio $\Delta R_{on}/R_{on(-30}$°C.$_)$ is 50% or less, where $R_{on(-30}$°C.$_)$ is an ON resistance of the entire power device at –30° C.; and $\Delta R_{on}$ is an increase in the ON resistance of the entire power device when a temperature of the power device is varied from –30° C. to 100° C.

2. The field-effect transistor power device of claim 1, wherein, when a channel mobility of electrons at 300K is 10 cm$^2$/Vs or above and the temperature of the power device is no less than –30° C. and no more than 100° C., the ON resistance in the channel region is no less than twice as much and no more than twenty times as much as the ON resistance in any region in the current path other than the channel region.

3. The field-effect transistor power device of claim 1, wherein a current having a current density of 50 A/cm$^2$ or more flows through the series current path.

4. The field-effect transistor power device of claim 1, wherein the wide band gap semiconductor is silicon carbide.

5. The field-effect transistor power device of claim 1, wherein,
   the power device comprises a silicon carbide substrate and a silicon carbide layer formed on a principal face of the silicon carbide substrate, and
   the source electrode is provided on the silicon carbide layer, and the drain electrode is formed on a back face of the silicon carbide substrate.

6. The field-effect transistor power device of claim 5, wherein the principal face of the silicon carbide substrate is a (0001) plane.

7. The field-effect transistor power device of claim 1, wherein a temperature-induced change in the ON resistance of the entire power device is derived by allowing a temperature-induced change $\Delta R_p$ in the ON resistance in any region in the current path other than the channel region and a temperature-induced change $\Delta R_n$ in the ON resistance in the channel region to cancel out each other.

8. The field-effect transistor power device of claim 7, wherein, when the temperature of the power device is varied from −30° C. to 100° C., an absolute value of the temperature-induced change $\Delta R_p$ is no less than ½ as much and no more than twice as much as the temperature-induced change $\Delta R_n$.

* * * * *

UNITED STATES PATENT AND TRADEMARK OFFICE
CERTIFICATE OF CORRECTION

PATENT NO. : 7,671,409 B2  Page 1 of 1
APPLICATION NO. : 11/570269
DATED : March 2, 2010
INVENTOR(S) : Makoto Kitabatake et al.

It is certified that error appears in the above-identified patent and that said Letters Patent is hereby corrected as shown below:

Title Page, under "OTHER PUBLICATIONS" the H. Yano et al. reference should include a publication year of (2000).

Signed and Sealed this

Ninth Day of November, 2010

David J. Kappos
*Director of the United States Patent and Trademark Office*